(12) United States Patent
Lim et al.

(10) Patent No.: US 7,402,472 B2
(45) Date of Patent: Jul. 22, 2008

(54) METHOD OF MAKING A NITRIDED GATE DIELECTRIC

(75) Inventors: Sangwoo Lim, Austin, TX (US); Paul A. Grudowski, Austin, TX (US); Tien Ying Luo, Austin, TX (US); Olubunmi O. Adetutu, Austin, TX (US); Hsing H. Tseng, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 344 days.

(21) Appl. No.: 11/067,257

(22) Filed: Feb. 25, 2005

(65) Prior Publication Data

US 2006/0194423 A1  Aug. 31, 2006

(51) Int. Cl.
*H01L 21/336* (2006.01)

(52) U.S. Cl. ............... 438/197; 438/287; 438/591; 438/769; 438/775

(58) Field of Classification Search ................ 438/197, 438/287, 775, 769, 591
See application file for complete search history.

(56) References Cited

U.S. PATENT DOCUMENTS

| 6,180,437 B1 * | 1/2001 | Moghe et al. | 438/128 |
| 6,342,437 B1 * | 1/2002 | Moore | 438/474 |
| 6,716,695 B1 * | 4/2004 | Hattangady et al. | 438/240 |
| 6,921,703 B2 * | 7/2005 | Bevan et al. | 438/287 |
| 2005/0260357 A1 * | 11/2005 | Olsen et al. | 427/569 |

* cited by examiner

*Primary Examiner*—Michael Trinh
(74) *Attorney, Agent, or Firm*—James L. Clingan, Jr.; Robert L. King

(57) ABSTRACT

A gate dielectric is treated with a nitridation step and an anneal. After this, an additional nitridation step and anneal is performed. The second nitridation and anneal results in an improvement in the relationship between gate leakage current density and current drive of the transistors that are ultimately formed.

11 Claims, 4 Drawing Sheets

METHOD OF MAKING A NITRIDED GATE DIELECTRIC

FIELD OF THE INVENTION

This invention relates to making semiconductor devices, and more particularly, to making semiconductor device structures that have nitrided gate dielectrics.

RELATED ART

As semiconductor device structures have continued to get smaller, gate dielectrics have also become thinner. A difficulty with this is demonstrated in FIG. 1, a semi-log plot, which shows that as the effective gate thickness, Tox (the effective gate oxide thickness as an electrical measurement from gate to channel), decreases, the leakage current density, Jg, through the gate dielectric increases significantly. At the lower gate thicknesses, a mere change of 2 Angstroms, causes a factor of 10 increases in leakage current density. The primary motivation for decreasing the gate dielectric thickness is to improve the current drive of the transistors, Ion. Current drive and gate thickness generally have a correspondence of a decrease in thickness of 10% increases current drive by 10%. Thus for the case where a 2 Angstrom decrease in thickness is about 10%, there is only a 10% increase in drive current but a ten times increase in leakage current density. Thus, as gate dielectric thicknesses have gotten into the 20-30 Angstrom range, it has become increasingly difficult to find a way to achieve increases in current drive through reductions in gate dielectric thickness while maintaining leakage current at a reasonable level.

Thus, there is a need to find a way to achieve increases in current drive while maintaining gate current leakage at a reasonable level.

BRIEF DESCRIPTION OF THE DRAWINGS

The present invention is illustrated by way of example and not limited by the accompanying figure, in which like references indicate similar elements, and in which.

Skilled artisans appreciate that elements in the figure are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a gate dielectric is treated with a nitridation step and an anneal. After this, an additional nitridation step and anneal is performed. The second nitridation and anneal results in an improvement in the relationship between gate leakage current density and current drive of the transistors that are ultimately formed. This is better understood by reference to the FIGS. and the following description.

Figure 1:
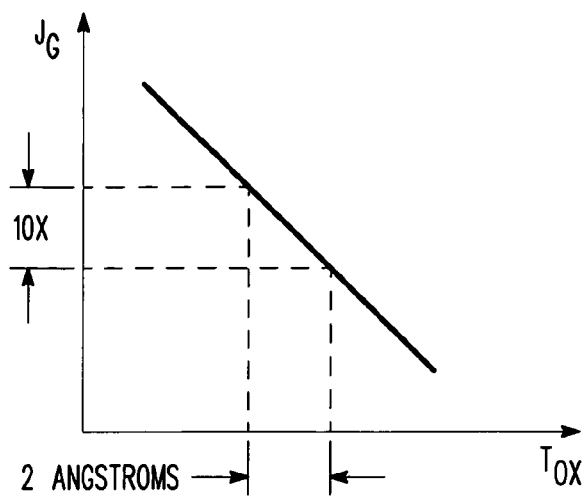
FIG. 1 is a graph of effective gate thickness versus gate leakage current density.
Figure 2:
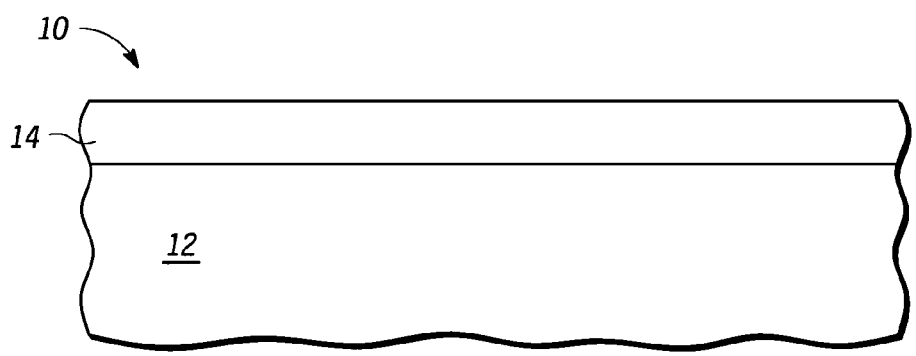
FIG. 2 is a cross section of a device structure at a stage in a process according to a first embodiment of the invention.

Shown in FIG. 2 is a device structure 10 comprising a semiconductor substrate 12, and a gate dielectric 14 on substrate 12. Substrate 12 is preferably silicon but can be another semiconductor material such as silicon germanium. Semiconductor substrate 12 is shown as a bulk silicon substrate but could also be an SOI substrate. Gate dielectric 14 in this example is silicon oxide grown at high temperature and is about 12 Angstroms in thickness. Thicknesses herein are physical thicknesses unless stated otherwise.

Figure 3:
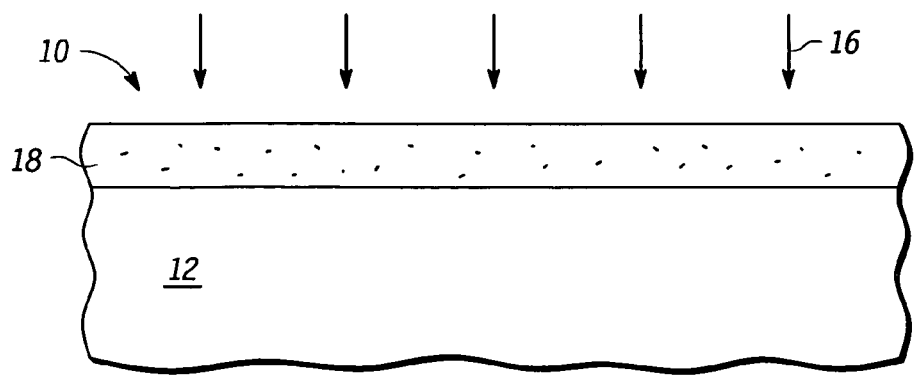
FIG. 3 is a cross section of the device structure of FIG. 2 at a stage in the process subsequent to that shown in FIG. 2.

Shown in FIG. 3 is device structure 10 after a plasma nitridation step 16 which causes a change in gate dielectric 14 to be a gate dielectric 18 that is nitrogen doped. Doping gate dielectric 14 to become gate dielectric 18 is preferably achieved by plasma but other methods such as furnace or implanting could be used. Disadvantages of doping with nitrogen by both furnace and implanting is that there is likely to be more nitrogen at the interface between gate dielectric 18 and substrate 12 than by plasma. An example of such plasma nitridation is to achieve a nitrogen concentration of 3 to 10 atomic percent.

Figure 4:
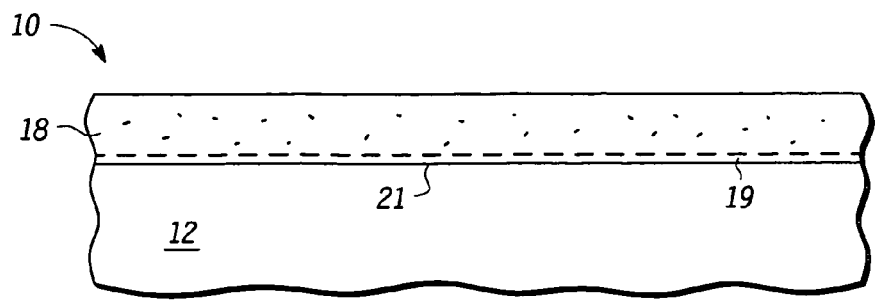
FIG. 4 is a cross section of the device structure of FIG. 3 at a stage in the process subsequent to that shown in FIG. 3.

Shown in FIG. 4 is device structure 10 after performing an anneal in an oxygen ambient. This has the effect of growing an oxide layer 19 of about 1 Angstrom which is nitrogen free. The anneal is preferably performed at about 1000 degrees Celsius. An exemplary process is with the oxygen being applied as molecular oxygen at a flow rate of about 250 SCCM at about 10 Torr. As an option, a further oxide growth step can be performed to make oxide layer 19 thicker. As another alternative, the anneal step can be performed in an inert ambient such an N2 or argon followed by an oxide growth step. In the case of using an inert ambient, oxide layer 19 is not formed. An anneal in an oxygen ambient is somewhat similar to an oxide growth in that they both are at relatively high temperature and the formation of the oxide is by a growth of oxide at the interface between the gate dielectric layer 18 and the substrate 12. If both are performed, the difference is primarily in the oxide growth being at a relatively lower temperature than the anneal and is performed for a longer time period. The formation of a device structure similar to device structure 10 of FIG. 4 by nitridation and anneal is known to have the benefit of reducing the gate leakage but at the cost of reducing current drive. This is believed to be the result of forming an oxide layer at an interface between the substrate and the plasma nitride dielectric layer by annealing the gate nitrided dielectric to displace a portion of nitrogen from the interface thereby forming an atomically smoother interface.

The formation of device structure 10 of FIG. 4 differs from the prior art in that device structure 10 of FIG. 4 is made in preparation for a subsequent nitridation and anneal.

Figure 5:
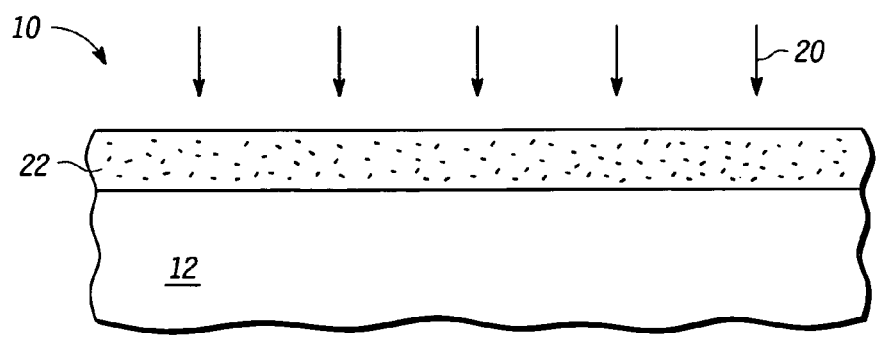
FIG. 5 is a cross section of the device structure of FIG. 4 at a stage in the process subsequent to that shown in FIG. 4.

Shown in FIG. 5 is device structure 10 after performing a plasma nitridation step 20. This has the effect of increasing the percentage of nitrogen by adding an additional 1 to 3 atomic percent. For example, if the nitrogen concentration was 3 atomic percent in device structure 10 of FIG. 3, the concentration in device structure 10 of FIG. 5 is about 4 to 6 percent. This process can be identical to the process used in the nitridation step shown in FIG. 3.

Figure 6:
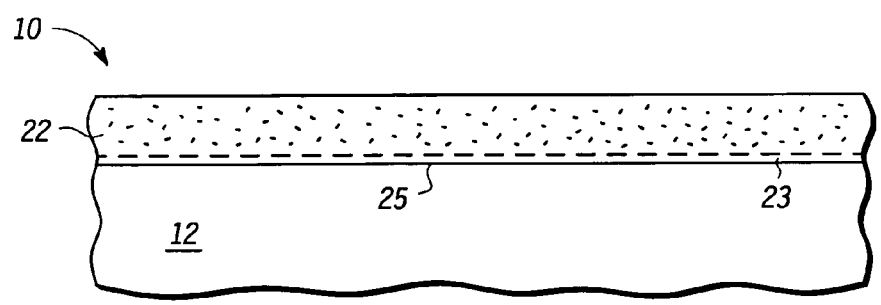
FIG. 6 is a cross section of the device structure of FIG. 5 at a stage in the processing subsequent to that shown in FIG. 5.

Shown in FIG. 6 is device structure 10 after an anneal in an oxygen ambient which forms an oxide layer 23 that is substantially nitrogen free. The anneal is preferably performed at about 1100 degrees Celsius. An exemplary process is with the oxygen being applied as molecular oxygen at a flow rate of about 250 SCCM at about 10 Torr.

Figure 7:
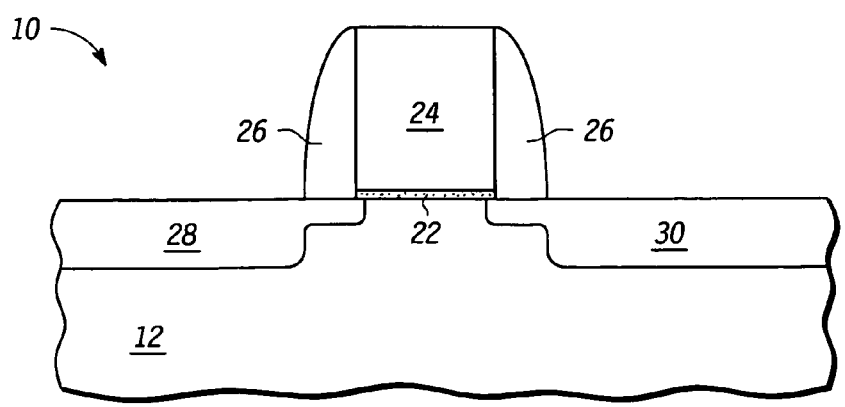
FIG. 7 is a cross section of the device structure of FIG. 6 at a stage in the process subsequent to that shown in FIG. 6.

Shown in FIG. 7 is device structure 10 as a transistor using gate dielectric 22 as the gate dielectric for the transistor. The transistor comprises a gate electrode 24 over gate dielectric 22, a sidewall spacer 26 around gate 24, a source/drain 28 in substrate 12 and is adjacent to gate 24 on one side, and a source/drain 30 in substrate 12 and adjacent to gate 24 on the other side.

Figure 8:
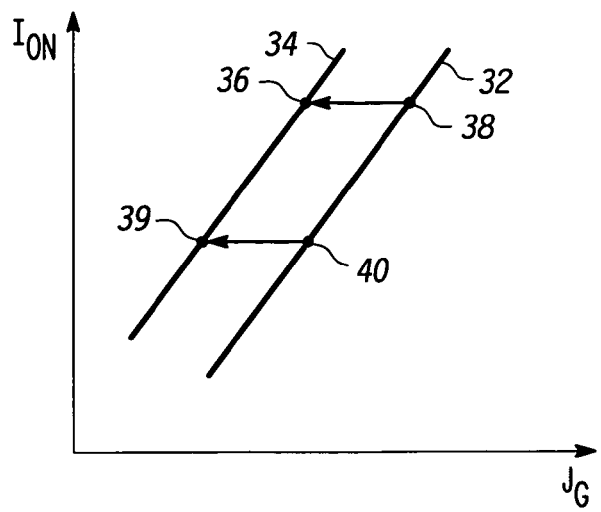
FIG. 8 is graph showing current drive versus gate leakage current density for one nitridation and anneal and for an additional nitridation and anneal.

Shown in FIG. 8 is a plot a of a curve 32 and curve 34 of current drive (Ion) versus gate leakage current density (Jg). Curve 32 is for the case of both a single nitridation and an anneal as well as no nitridation and anneal. Curve 34 is for the case of an additional nitridation and anneal as shown in FIGS. 2-7. The single nitridation and anneal doesn't substantially change from the curve of no nitridation and anneal but simply moves the location along curve 32 in the direction of less leakage and less current drive. The second nitridation and anneal causes a shift in curve 32 to curve 34. This is believed to be a result of further localization of nitridation away from substrate 12 and a substantially nitrogen-free interface at interface 25 between oxide layer 23 and substrate 12. A location 36 on curve 34 has the same current drive as location 38 on curve 32 but has lower current leakage density than location 38. Similarly, a location 39 on curve 34 has lower current leakage density than location 40 while maintaining the same current drive.

This improvement depicted in FIG. 8 has been found by doing the second nitridation and anneal at the same conditions as the first nitridation and anneal. For example, both nitridations performed at 350 watts, 20% duty cycle, 10 kilohertz, for 15 seconds, at 10 milliTorr, 250 SCCM nitrogen flow rate and both anneals performed at 1000 degrees Celsius, at 0.5 Torr, for 15 seconds, and 250 SCCM flow rate of oxygen results in an improvement of about 70% in gate leakage current density while keeping the drive current substantially the same.

Figure 9:
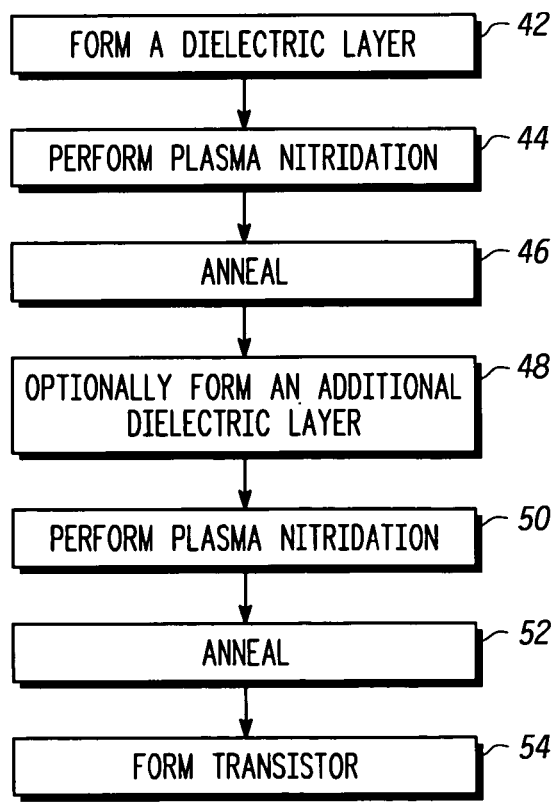
FIG. 9 is a flow diagram of a method according to the first embodiment of the invention.

Shown in FIG. 9 is a flow diagram showing the process steps for forming device structure 10 of FIG. 7 and provides the benefit depicted in FIG. 8. Step 42 is forming a gate dielectric layer. Performing plasma nitridation follows as step 44. Step 46 is an anneal which is preferably performed in an oxygen ambient. Step 48 is an optional step of forming more gate dielectric. This would normally not need to be performed if the anneal step occurs in an oxygen ambient. Step 50 is another nitridation step, preferably performed in the same manner as step 44. Step 52 is another anneal step, preferably performed in the same manner as step 46. In this flow, after two nitridation/anneal steps, a transistor is formed in step 54. Nitridation/anneal steps can exceed two prior to forming the transistor.

FIGS. 10-13 show an alternative embodiment to that for FIGS. 2-7.

Figure 10:
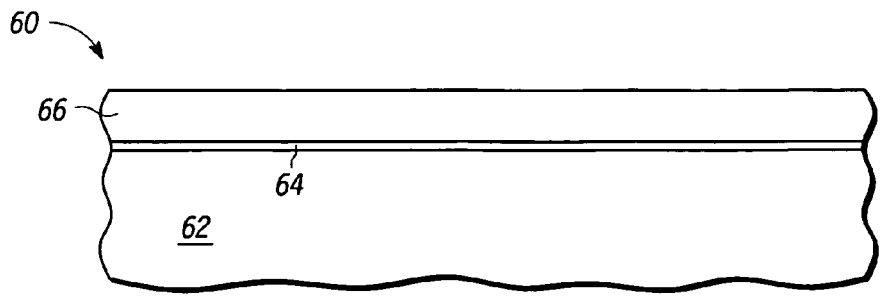
FIG. 10 is a cross section of a device structure at a stage in a process according to a second embodiment of the invention.

Shown in FIG. 10 is a device structure 60 comprising a semiconductor substrate 62 and a gate dielectric comprised of an interfacial oxide layer 64 on substrate 62 and a high K dielectric layer that could be, for example, a metal oxide, a metal silicate, a metal aluminate, a metal silicon oxynitride, or a metal lanthanate. Substrate 12 is preferably silicon but can be another semiconductor material such as silicon germanium. Semiconductor substrate 62 is shown as a bulk silicon substrate but could also be an SOI substrate. High K dielectric layer 66 in this example is hafnium oxide deposited by atomic layer deposition (ALD). Interfacial oxide layer 64 is an oxide layer that, as a practical matter, is always present when forming gate dielectrics, especially on silicon.

Figure 11:
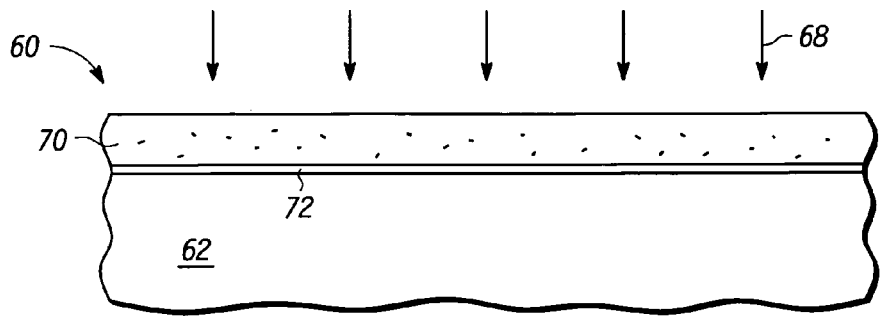
FIG. 11 is a cross of the device structure of FIG. 10 at a stage in the process subsequent to that shown in FIG. 10.

Shown in FIG. 11 is device structure 60 after a plasma nitridation step 68 which causes a change in high K dielectric layer 70 to be a metal oxide layer 70 that is nitrogen-doped and a change in interfacial oxide layer 64 to be an interfacial oxide layer 72 that has trace nitrogen present. Doping high K dielectric layer 66 to become high K dielectric layer 70 is preferably achieved by plasma but other methods such as furnace or implanting could be used but with the disadvantages previously described. An example of such plasma nitridation is to achieve a nitrogen concentration of 3 to 10 atomic percent. An anneal in an oxygen ambient follows. The anneal is preferably performed at about between 1000 and 1200 degrees Celsius. An exemplary process is with the oxygen being applied as molecular oxygen at a flow rate of about 250 SCCM at about 10 Torr. As an option, a further high K dielectric deposition step can be performed to make high K layer 70 thicker. The formation of a device structure similar to device structure 60 of FIG. 11 by nitridation and anneal is known and is known to have the benefit of reducing the gate leakage but at the cost of reducing current drive. This is believed to be the result of forming an oxide layer at an interface between the substrate and the plasma nitrided dielectric layer by annealing the gate nitrided dielectric to displace a portion of nitrogen from the interface thereby forming an atomically smoother interface.

The formation of device structure 60 of FIG. 11 differs from the prior art in that device structure 60 of FIG. 11 is made in preparation for a subsequent nitridation and anneal.

Figure 12:
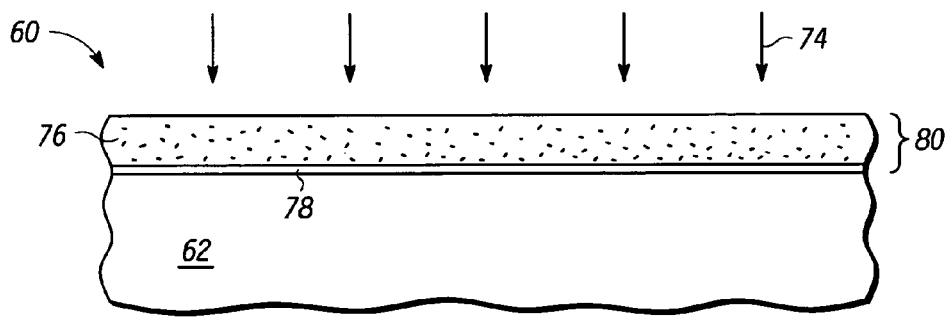
FIG. 12 is a cross of the device structure of FIG. 11 at a stage in the process subsequent to that shown in FIG. 11.

Shown in FIG. 12 is device structure 60 after performing a plasma nitridation step 20 and an anneal in an oxygen ambient. This process can be identical to the process used in the nitridation and anneal step shown in FIG. 11. This has the effect of altering high K dielectric layer 70 and interfacial layer 72 to form high K dielectric layer 76 and interfacial oxide layer 78, respectively. Layers 76 and 78 comprise a gate dielectric 80.

Figure 13:
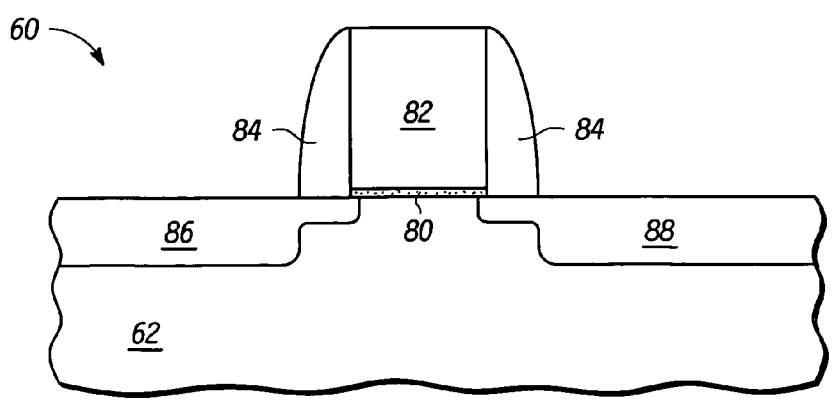
FIG. 13 is a cross of the device structure of FIG. 12 at a stage in the process subsequent to that shown in FIG. 12.

Shown in FIG. 13 is device structure 60 as a transistor using gate dielectric 80 as the gate dielectric for the transistor. The transistor comprises a gate 82 over gate dielectric 80, a sidewall spacer 84 around gate 82, a source/drain 86 in substrate 62 and is adjacent to gate 82 on one side, and a source/drain 88 in substrate 62 and adjacent to gate 82 on the other side.

This describes a double nitridation/anneal process. The number of nitridation/anneal steps described can continue past two. In the metal oxide example, benefits of the multiple nitridation/anneal steps over a single nitridation anneal is the modulation of the nitrogen profile and improvement of high K dielectric quality.

In the foregoing specification, the invention has been described with reference to specific embodiments. However, one of ordinary skill in the art appreciates that various modifications and changes can be made without departing from the scope of the present invention as set forth in the claims below. Certain materials were described and these may be varied. As further alternatives, hafnium oxide was described as the exemplary metal oxide but other high K dielectrics may be used such as zirconium oxide or other metal oxides such as lanthanum aluminum oxynitride may also benefit from this process. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a gate dielectric, comprising:
    forming a dielectric layer overlying a substrate;
    performing a first nitridation step by exposing the dielectric layer to plasma nitridation to form a plasma nitrided dielectric layer;
    forming an oxide layer at an interface between the substrate and the plasma nitrided dielectric layer by annealing, in the presence of oxygen, the nitrided dielectric layer to displace a portion of nitrogen from the interface thereby forming an atomically smoother interface;
    performing a second nitridation step by exposing the plasma nitrided dielectric layer to plasma nitridation to add more nitrogen to the plasma nitrided dielectric layer; and
    after the second nitridation step, annealing the plasma nitrided dielectric in the presence of oxygen layer to treat the interface between the substrate and the plasma nitrided dielectric layer by further smoothing the interface and thereby form the gate dielectric so that the interface is substantially nitrogen free;
    wherein the gate dielectric is formed without a deposition after the step of forming the dielectric layer.

2. The method of claim 1 further comprising:
    forming the dielectric layer as one of silicon dioxide, a metal oxide, a metal silicate, a metal aluminate, or a combination of a predetermined metal or a combination of multiple metals and one of an oxide, a silicate, a lanthanate, or an aluminate.

3. The method of claim 2 further comprising:
    forming the metal oxide as hafnium oxide.

4. The method of claim 1 wherein forming the oxide layer further comprises:
    forming the oxide layer at the interface between the substrate and the plasma nitrided dielectric layer by annealing the gate nitrided dielectric at a temperature within a range of substantially five hundred degrees to twelve hundred degrees.

5. The method of claim 1 wherein forming the oxide layer further comprises:
    annealing the gate nitrided dielectric in an inert ambient at a temperature within a range of substantially five hundred degrees to twelve hundred degrees; and
    placing the gate nitrided dielectric in an oxygen ambient to form the oxide layer at the interface between the substrate and the plasma nitrided dielectric layer.

6. The method of claim 1 further comprising:
    forming the dielectric layer by growing the dielectric layer over the substrate.

7. The method of claim 1 further comprising:
    repeating the following steps a predetermined number of times from one to one hundred:
    (1) performing the first nitridation step; and
    (2) annealing in the presence of oxygen.

8. A method for forming a gate nitrided dielectric, comprising:
    (a) forming a dielectric layer overlying a substrate and creating an oxide layer at an interface between the substrate and the dielectric layer;
    (b) exposing the dielectric layer to a plasma nitridation to form a plasma nitrided dielectric layer;
    (c) annealing the plasma nitrided dielectric layer at a predetermined temperature in the presence of oxygen; and
    (d) repeating steps (b) and (c) a predetermined number of times from one to one hundred to form a gate dielectric that has an interface with the substrate that is substantially nitrogen free.

9. A method for forming a transistor in and on a semiconductor, comprising:
    (a) forming a gate dielectric layer overlying a substrate, wherein the substrate comprises the semiconductor;
    (b) exposing the gate dielectric layer to a nitrogen ambient to form nitrogen in the gate dielectric layer and thereby form a nitrided gate dielectric layer; and
    (c) annealing the nitrided gate dielectric layer in the presence of oxygen; and
    repeating steps (b) and (c) a predetermined number of times to result in an interface between the nitrided gate dielectric layer and the substrate being substantially nitrogen free;
    forming a gate electrode overlying the nitrided gate dielectric layer that has a substantially nitrogen free interface with the substrate; and
    forming first and second current electrodes adjacent the gate electrode to provide a the transistor in and on the semiconductor.

10. The method of claim 9 further comprising:
    forming the gate dielectric layer as one of silicon dioxide, a metal oxide, a metal silicate, a metal aluminate or a combination of a predetermined metal or a combination of multiple metals and one of an oxide, a silicate, lanthanate, or an aluminate.

11. The method of claim 9 further comprising:
    forming the gate dielectric layer by forming hafnium oxide by deposition by one of ALD, MOCVD and PVD.

* * * * *